(12) United States Patent
Baba et al.

(10) Patent No.: US 6,475,317 B1
(45) Date of Patent: Nov. 5, 2002

(54) METHOD FOR MANUFACTURING ELECTRONIC COMPONENT OF LAMINATED CERAMICS

(75) Inventors: Hiroyuki Baba, Takefu (JP); Koji Kato, Takefu (JP); Yasunobu Yoneda, Takefu (JP); Takao Hosokawa, Fukui-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/510,918

(22) Filed: Feb. 22, 2000

(30) Foreign Application Priority Data

Feb. 23, 1999 (JP) ............................. 11-044181
Dec. 28, 1999 (JP) ............................ 11-374644

(51) Int. Cl.$^7$ ............................. C03B 29/00; B05D 5/12
(52) U.S. Cl. ............................. 156/89.12; 156/89.16; 427/79; 427/96; 427/126.2
(58) Field of Search ................ 156/89.12, 89.16; 427/96, 126.2, 79, 80

(56) References Cited

U.S. PATENT DOCUMENTS

| | | | | |
|---|---|---|---|---|
| 4,677,254 A | * | 6/1987 | Boss et al. ............ | 156/89.12 |
| 5,009,744 A | | 4/1991 | Mandai et al. | |
| 5,316,602 A | | 5/1994 | Kogame et al. | |
| 5,692,280 A | | 12/1997 | Taniguchi et al. | |
| 5,700,548 A | | 12/1997 | Warnier et al. | |
| 5,935,358 A | * | 8/1999 | Yamasaki ............ | 156/89.12 |

FOREIGN PATENT DOCUMENTS

| | | |
|---|---|---|
| JP | 1226140 | 9/1989 |
| JP | 266916 | 3/1990 |
| JP | 3105905 | 5/1991 |
| JP | 714745 | 1/1995 |
| JP | 9153429 | 6/1997 |
| JP | 52135051 | 11/1997 |

OTHER PUBLICATIONS

English language Abstract of JP 01–226140, Nakao et al., Sep. 8, 1989.*
A Handbook of a Electronics Mounting, p. 228, (1977).

* cited by examiner

*Primary Examiner*—Richard Crispino
*Assistant Examiner*—Kevin P. Shortsle
(74) *Attorney, Agent, or Firm*—Dickstein, Shapiro, Morin & Oshinsky, LLP

(57) ABSTRACT

The present invention provides a method for manufacturing an electronic component of laminated ceramics such as a laminated ceramic capacitor in which, when a ceramic paste is applied on a ceramic green sheet in order to substantially eliminate steps caused by the thickness of a film of inner circuit elements such as an inner electrode, the ceramic paste is prevented from generating a gap between the paste and the film of inner circuit elements, or the thickness of the ceramic paste is prevented from being increased, by allowing the paste to overflow the film of inner circuit elements, even when the application position has been a little shifted, wherein an inclined face is formed at the periphery of an inner electrode that serves as the film of inner circuit elements, the ceramic paste being applied so as to overlap the periphery of the inner electrode, and wherein the used ceramic paste contains about 40% by weight to 85% by weight of solvents in order to facilitate smooth leveling of the applied ceramic paste.

17 Claims, 4 Drawing Sheets

METHOD FOR MANUFACTURING ELECTRONIC COMPONENT OF LAMINATED CERAMICS

BACKGROUND OF THE INVENTION

1. Field of the Invention

The present invention relates to a method for manufacturing electronic components of laminated ceramics such as laminated ceramic capacitors, laminated inductors, multi-layer circuit boards and laminated piezoelectric members. The present invention particularly relates to a method for manufacturing electronic components of laminated ceramics comprising the processes of laminating a plurality of ceramic green sheets on which films of inner circuit elements such as conductive films having a given thickness are partially formed.

2. Description of the Related Art

A plurality of ceramic green sheets are prepared and laminated for manufacturing electronic components of laminated ceramics such as laminated ceramic capacitors. Films of inner circuit elements such as conductor films and resistor films for constructing capacitors, resistors, inductors, varistors and filters are formed on a specified green sheet depending on the desired functions of the electronic component of laminated ceramics.

Thin layer and multi-layer ceramic green sheets have been developed in order to make the electronic component of laminated ceramics have a small size and have high performance. For example, the laminated ceramic capacitor may be small size while having a large capacitance by laminating a plurality of the thin ceramic green sheets. However, the thickness of the film of inner circuit elements greatly influences the performance of the ceramic components as the green sheet is made thinner and larger numbers of the ceramic green sheets are laminated, causing the following problems.

Step heights are accumulated by the difference of thickness between the portions where the film of inner circuit elements is formed and not formed, when the film of inner circuit elements is formed on the ceramic green sheets followed by laminating the sheets. Therefore, the pressure used to press the laminate obtained by laminating the ceramic green sheet is not uniformly applied along the direction of the principal faces of the ceramic green sheets, sometimes causing delamination of the laminate. Otherwise, the surface of the laminate partially expands to form non-plane surface that generates cracks in the firing process thereafter.

For solving these and other problems, it is proposed to eliminate the steps on the ceramic green sheets by applying the ceramic paste by screen printing, photogravure printing or relief printing on the area of the ceramic green sheet where no films of inner circuit elements are formed.

The method for manufacturing the ceramic capacitor will be described in more detail with reference to FIG. 1. Ceramic green sheets 1a and 1b are prepared at first as shown by the processes (1A) and (1B) in FIG. 1.

Inner electrodes 2a and 2b as films of inner circuit elements are formed on the principal faces of the ceramic green sheets 1a and 1b as shown by the processes (2A) and (2B) in FIG. 1. These inner electrodes 2a and 2b have given thicknesses, respectively, thereby steps 3a and 3b appear due to the thickness of each film.

In the process for forming the inner electrode 13 (FIG. 4B), the inner electrodes 2a and 2b are formed so as to merely reach one terminal edge along the longitudinal direction located at the end along the longitudinal direction of respective rectangular principal faces of the ceramic green sheets 1a and 1b, and not to reach the two terminal edges located at the ends along the transverse direction and the other terminal edges located at the end along the longitudinal direction.

As shown by the processes (3A) and (3B) in FIG. 1, ceramic pastes 4a and 4b are applied by screen printing, photogravure printing or relief printing on the area of the principal faces of the ceramic green sheets 1a and 1b where no inner electrodes 2a and 2b are formed, thus substantially eliminating the steps 3a and 3b due to the inner electrodes 2a and 2b as shown by the processes (2A) and (2B) in FIG. 1.

The ceramic pastes 4a and 4b should have a viscosity of given value or more for maintaining resolution of the ceramic pastes 4a and 4b applied by printing higher than a prescribed level in the printing processes of the ceramic pastes 4a and 4b. Accordingly, the content of solvents in the ceramic pastes 4a and 4b is usually adjusted to 35% by weight or less.

The ceramic green sheets 1a and 1b shown by the processes (3A) and (3B) in FIG. 1, respectively, are alternately laminated. This means that the terminal edges at the ends along the longitudinal direction where the inner electrode 2a or 2b reach, and the terminal edges at the ends along the longitudinal direction where the inner electrode 2a or 2b do not reach, are alternately arranged along the direction of lamination. A laminate 5 as shown by the process (4) in FIG. 1 is obtained by laminating the ceramic green sheets 1a and 1b.

The laminate 5 is fired after pressing. A desired laminated ceramic capacitor is completed by forming auxiliary circuits at both ends of the laminate 5.

Since the steps 3a and 3b due to the thicknesses of the inner electrodes 2a and 2b can be substantially eliminated by the methods as described above, the ceramic green sheets 1a and 1b can be laminated without being substantially affected by the thicknesses of the ceramic green sheets 1a and 1b. Accordingly, the thin ceramic green sheets 1a and 1b can be laminated while allowing delamination and cracks in the laminate 5 to be scarcely generated.

A method for obtaining one laminate 5 is illustrated in FIG. 1. However, each process shown in FIG. 1 is usually carried out so as to manufacture a mother laminate for yielding a number of laminates 5, in order to efficiently obtain a plurality of laminates 5. The mother laminate is cut to isolate individual laminates 5 from it by executing each process shown in FIG. 1. For this purpose, each ceramic green sheet 1a and 1b shown in FIG. 1 is prepared as a mother sheet having a large dimension. The inner electrodes 2a and 2b are formed, and the ceramic pastes 4a and 4b are applied on this mother sheet, followed by laminating the mother green sheets.

However, the method for eliminating the steps on the ceramic green sheets as hitherto proposed involves the following problems.

FIG. 2 shows an extended cross section of a part of the ceramic green sheet 1 as a mother sheet, and a part of the inner electrode 2 formed on the principal face of the green sheet as described above. The ceramic paste 4 inadequately applied on the principal face of the ceramic green sheet 1 is also illustrated, although the object of applying the ceramic paste has been to substantially eliminate the steps due to the thickness of the inner electrode 2.

While the ceramic paste 4 is applied by screen printing, photogravure printing or relief printing as described above, the positional accuracy of these printing methods is about 30 to 200 μm. Consequently, a part of the ceramic paste 4 overflows on the inner electrode 2 when the printing position has shifted, thereby enhancing the step rather than demising it.

For avoiding the foregoing problems from occurring, it is proposed to designed the printing pattern of the ceramic paste 4 so as to form a gap 6 (FIG. 3) with a space of, for example, several tens microns between the ceramic paste 4 and the inner electrode 2, thereby allowing the ceramic paste 4 to hardly overflow on the inner electrode 2 even when the printing position has been a little shifted. However, this method also involves some problems that the terminal edge of the inner electrode 2 is apt to be distorted by the presence of the gap 6, or that structural defects such as voids are liable to be generated in the laminate after firing.

SUMMARY OF THE INVENTION

Accordingly, the object of the present invention is to provide a method for manufacturing an electronic component of laminated ceramics that is able to solve the problems as hitherto described. In a first aspect, the present invention provides a method for manufacturing an electronic component of laminated ceramics comprising the processes of:

preparing a ceramic green sheet; partially forming a film of inner circuit elements on the principal face of the ceramic green sheet while forming steps corresponding to the thickness of the film; applying a ceramic paste on the principal face of the ceramic green sheet so that steps due to the thickness of the film of the inner circuit elements are substantially eliminated; and laminating the ceramic green sheets on which the ceramic paste has been applied.

In the first aspect for solving the technical problems as hitherto described, the film of inner circuit elements is formed at the periphery of the film to give an inclined face with an acute angle against the principal face of the ceramic green sheet in the process for forming the film of inner circuit elements, and the ceramic paste is applied so as to overlap the periphery of the film of inner circuit elements in the step for forming the film of inner circuit elements.

In the second aspect, the ceramic paste is also coated so as to overlap the periphery of the film of inner circuit elements in the process for coating the ceramic paste, a ceramic paste containing about 40% by weight to 85% by weight of a solvent being used as the ceramic paste.

The method for manufacturing the electronic component of laminated ceramics in the third aspect of the present invention may comprise the features of the first and second aspects. The film of inner circuit elements is formed at the periphery of the film to give an inclined face with an acute angle against the principal face of the ceramic green sheet in the process for forming the film of inner circuit elements, and the ceramic paste is applied so as to overlap the periphery of the film of inner circuit elements, wherein a ceramic paste containing about 40% by weight to 85% by weight of a solvent is used as the ceramic paste.

The inclined face is preferably formed so as to have an angle of about 0.3 degree to about 30 degrees against the principal face of the ceramic green sheet in the first or third aspect of the present invention.

The ceramic paste is applied so as to overlap the periphery of the film of inner circuit elements with an overlap width of up to about 180 μm, preferably with an overlap width of about 20 to 140 μm, in the first to third aspect of the present invention.

Although the ceramic paste containing about 40% by weight to 85% by weight of a solvent is used in the second and third aspects of the present invention, it is also preferable to use the ceramic paste containing about 40% by weight to 75% by weight of the solvent in the first to third aspects of the present invention.

The present invention can be advantageously applied particularly to the method for manufacturing a laminated ceramic capacitor. The ceramic green sheet has a rectangular principal face when individual ceramic capacitor to be manufactured is a unit capacitor. In the process for forming the film of inner circuit elements that serves as an internal electrode for ensuring an electrostatic capacitance, the film of inner circuit elements is formed so as to merely reach one terminal edge along the longitudinal direction located at the longitudinal end of the rectangular face of the ceramic green sheet while being formed so as not to reach two terminal edges along the transverse direction located at the other terminal edge along the longitudinal direction and at the end along the transverse direction, respectively. A plurality of the ceramic green sheets are laminated so that the terminal edge along the longitudinal direction where the film of inner circuit elements reaches and the terminal edge along the longitudinal direction where the film of inner circuit elements does not reach are alternately arranged along the direction of lamination.

While the ceramic paste is coated on the entire area on the principal face of the ceramic green sheet where the film of inner circuit elements is not formed in the process for coating the ceramic paste, the ceramic paste may be merely coated on the area sandwiched between the terminal edge along the transverse direction of the principal face and the film of inner circuit element on the ceramic green sheet when the present invention is applied to the method for manufacturing the laminated ceramic capacitor.

DESCRIPTION OF THE PREFERRED EMBODIMENT

Figure 1:
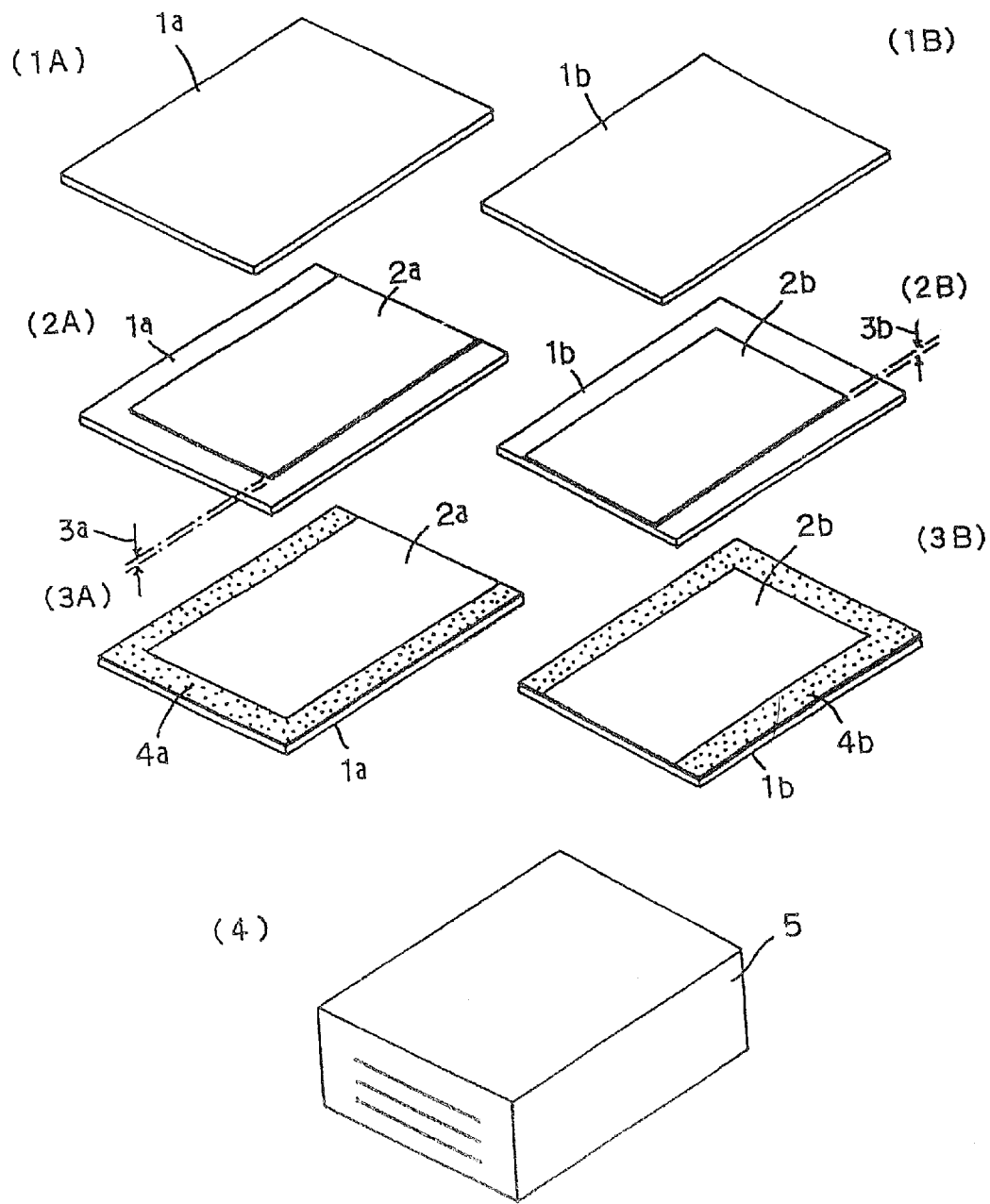
FIG. 1 is a perspective view showing the method for manufacturing the laminated ceramic capacitor concerning the present invention.
Figure 2:
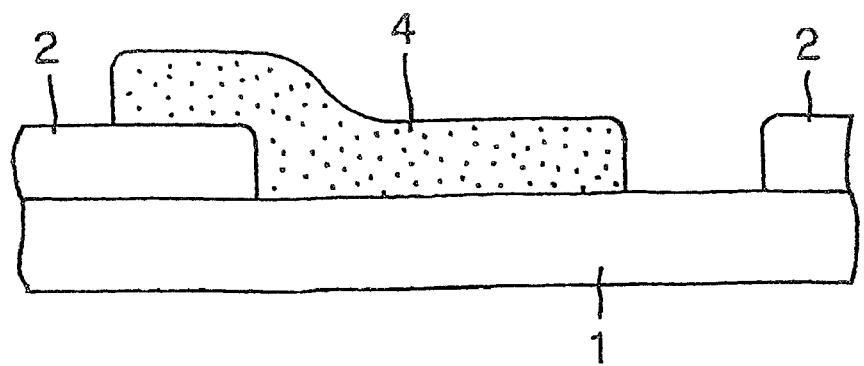
FIG. 2 is provided for illustrating the problems to be solved by the present invention, showing a cross section when the ceramic paste 4 is inadequately applied.
Figure 3:
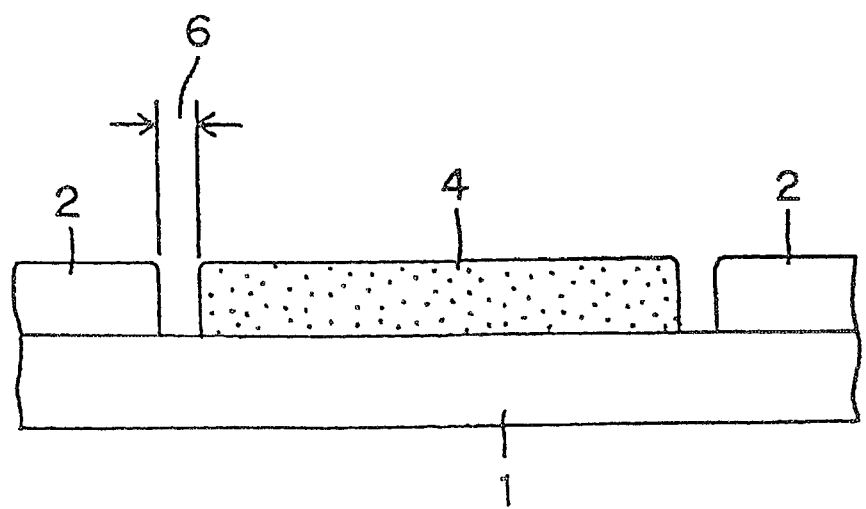
FIG. 3 is provided for illustrating the problems to be solved by the present invention, showing a cross section when the ceramic paste 4 is applied forming a gap between the ceramic paste and the inner electrode 2.
Figure 4A:
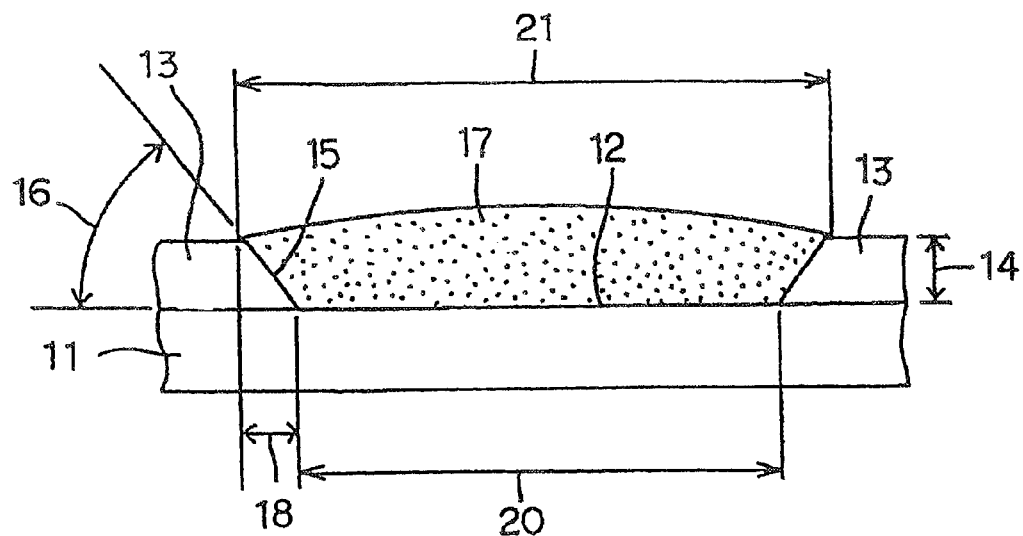
FIGS. 4A and 4B illustrate the cross sections of characteristic processes provided in the method for manufacturing the electronic component of laminated ceramics according to one embodiment of the present invention, wherein the process (1) denote the ceramic paste 17 immediately after coating, and the process (2) denote the dried ceramic paste at a give lapse of time after coating.
Figure 4B:
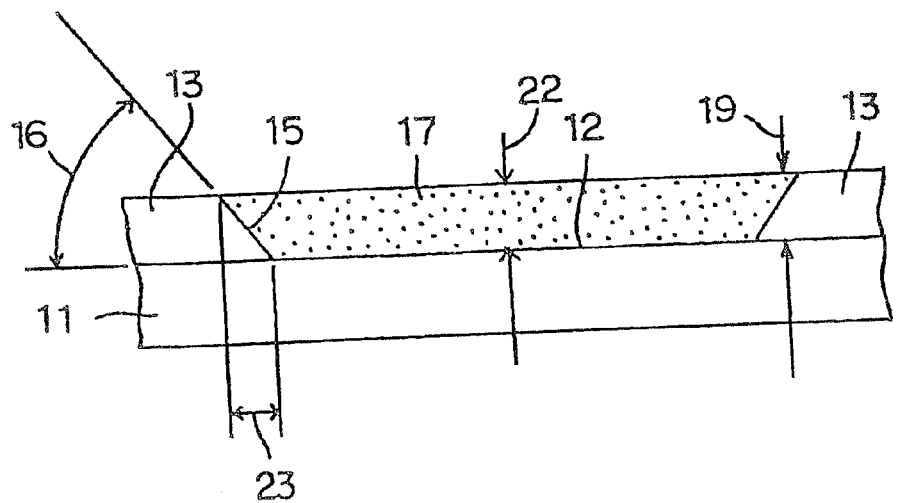

When the method for manufacturing the electronic component of laminated ceramics according to one embodiment of the present invention is applied, for example, to a method for manufacturing the laminated ceramic capacitor, the processes shown in FIG. 1 is basically used preferably in a mother green sheet for improving productivity. FIGS. 4A and 4B shows cross sections of the characteristic processes involved in the method for manufacturing the laminated ceramic capacitor in the embodiment according to the present invention.

With reference to FIG. 4A, a ceramic green sheet 11 is prepared as a mother sheet. Then, inner electrodes 13 as films of inner circuit elements are partially formed on a principal face 12 of the ceramic green sheet 11 so as to allow them to distribute over various portions on the sheet. The thickness of the inner electrodes 13 brings about steps 14 on the principal face 12 of the ceramic green sheet 11.

The ceramic green sheet 11 has a rectangular principal face 12 when individual ceramic capacitors to be formed as unit capacitors in the process for forming the inner electrode 13 as described above. The inner electrode 13 is formed so as to merely reach one terminal edge along the longitudinal direction located at the longitudinal end of the rectangular principal face 12 of the ceramic green sheet 11 while being formed so as not to reach two terminal edges along the transverse direction located at the other terminal edge along the longitudinal direction and at the end along the transverse direction of the principal face 12.

In a characteristic construction of the present invention, the inner electrode 13 is formed at the periphery of the film so as to give an inclined face 15 having an acute angle against the principal face 12 of the ceramic green sheet 11 in the process for forming the inner electrode 13. The angle 16 of the inclined face 15 against the principal face 12 is preferably selected to be within a range of about 0.3 degree to 30 degrees.

While the inner electrode 13 may be formed by printing such as screen printing, photogravure printing or relief printing, the inclined face 15 as described above can be easily formed by using a mask or a screen for printing, or by adjusting the viscosity of a conductive paste used for forming the inner electrode 13. When the inner electrode 13 is formed by printing, it is dried in the next process. When the inner electrode 13 is formed by dry plating such as sputtering, the incline face 15 can be also easily formed by devising the mask.

The ceramic paste 17 is applied in the next process by, for example, screen plating, photogravure printing or relief printing on the entire area on the principal face 12 of the ceramic green sheet 11 where the inner electrode 13 is not formed, so as to substantially eliminate the steps 14 due to the thickness of the inner electrode 13. While the ceramic paste 17 contains a ceramic powder, a binder and a solvent, it is preferable that the ceramic powder contained in the ceramic paste has substantially the same component as that used in the ceramic green sheet 11.

In the characteristic construction of the present invention, the ceramic paste 17 is coated so as to overlap the periphery of the inner electrode 13 with an overlap width 18 as shown in FIG. 4A.

Gaps between the inner electrode 13 and the ceramic paste 17 are prevented from generating even when printing positions have been shifted, by allowing the ceramic paste 17 to overlap the periphery of the inner electrode 13.

Since the inclined face 15 is formed at the periphery of the inner electrode 13, the portions of the ceramic paste 17 that have overflowed on the periphery of the inner electrode 13 promptly flow back to the area between the two inner electrodes, and the surface of the paste is smoothly leveled after the ceramic paste 17 has been applied so as to overlap the periphery. In other words, the steps 14 at the inner electrode 13 serve for aligning the pattern of the ceramic paste 17, which is dried after being applied on the green sheet. Therefore, the ceramic paste 17 forms a substantially the same level as the surface of the inner electrode 13. foregoing overlap width 18 is preferably about 180 μm or less, more about 20 to 140 μm. For confirming the preferable overlap width, the experiments were carried out.

With reference to FIG. 4A, a ceramic green sheet 11 on which the inner electrodes 13 had been printed and dried, and a ceramic paste 17 were prepared at first. The thickness (the step 14) of the inner electrode 13 after drying was 5μm, the inclination angle 16 at the periphery of the inner electrode 13 was three degrees, and a ceramic paste 17 containing 60% of a solvent was prepared so as to be able to obtain a coating film having the same thickness as that of the inner electrode 13.

The ceramic paste 17 was coated on the principal face 12 of the ceramic green sheet 11 by screen printing as shown in the process (1) in FIG. 1. Samples in overlap width 18 was variously changed within a range of −40 μm to 300 μm as show in TABLE 1 below were manufactured.

TABLE 1

| OVERLAP WIDTH | RATIO OF OCCURRENCE OF STRUCTURAL DEFECTS | BENDING SITUATION | RATIO OF OCCURRENCE OF DEFECTIVE IR |
|---|---|---|---|
| −40 | 100/100 | x | — |
| −20 | 80/100 | x | — |
| 0 | 0/100 | Δ | 1/1000 |
| 20 | 0/100 | ○ | 0/1000 |
| 40 | 0/100 | ○ | 0/1000 |
| 60 | 0/100 | ○ | 0/1000 |
| 80 | 0/100 | ○ | 0/1000 |
| 100 | 0/100 | ○ | 0/1000 |
| 120 | 0/100 | ○ | 0/1000 |
| 140 | 0/100 | ○ | 0/1000 |
| 160 | 0/100 | Δ | 3/1000 |
| 180 | 0/100 | x | 10/1000 |
| 200 | 5/100 | x | 7/1000 |
| 220 | 3/100 | x | 7/1000 |
| 240 | 10/100 | x | 10/1000 |
| 260 | 8/100 | x | 15/1000 |
| 280 | 15/100 | x | 20/1000 |
| 300 | 12/100 | x | 18/1000 |

After drying the ceramic paste after screen printing, 300 sheets of the ceramic green sheets 11 on which the inner electrodes 13 and a pattern of the ceramic paste 17 had been formed were laminated, followed by laminating a ceramic green sheet on which neither the inner electrodes nor the pattern of the ceramic green sheet had been formed under the laminated sheets, thereby obtaining a mother laminate.

After pressing the mother laminate, it was cut with a dicing saw to isolate a plurality of chips, followed by firing the chips.

Presence of structural defects was accessed by visual observation of appearance of the fired chips thus obtained to determine the ratio of the samples having structural defects relative to the total number of the samples, or the ratio of occurrence of structural defects. Bending at the terminal of the inner electrode 13 was also accessed by observing the cross section of the chips after firing. The ratio of occurrence of structural defects and bending situations are listed in TABLE 1.

Bending at the terminal of the inner electrode 13 is caused, for example, by increasing the thickness at the overlap portions of the inner electrode 13 with the ceramic paste 17 when the terminal edge of the ceramic paste 17 flows over the inclined face 15 at the periphery of the inner electrode 13, or by distortion of the inner electrode 13 along the gaps formed between the inner electrode 13 and the ceramic paste 17. The chips substantially having no bending, having slight bending, and having large bending are marked by "○", "Δ" and "x", respectively, in TABLE 1.

TABLE 1 shows that the samples with overlap widths of −40 μm and −20 μm, or the samples in which gaps between the inner electrode 13 and the ceramic paste 17 are formed, exhibit relatively higher ratios of occurrence of structural defects. A ratio of occurrence of structural defects of 0/100 could be observed, on the other hand, in one sample having an overlap width of zero micrometer, or a gap width of zero micrometer, and some samples listed in the table thereafter.

When the overlap widths 18 were increased to about 100 μm among the samples having a ratio of occurrence of defects of 0/100, the terminal edge of the ceramic paste 17 had flowed over the inclined face 15 at the periphery of the ceramic paste. Consequently, the thickness at the overlap portions of the inner electrode 13 with the ceramic paste 17 was increased, thereby generating bending at the terminal edge of the inner electrode 13, as observed at the cross section of the chip after firing. However, no chips having structural defects were observed when the overlap width was about 180 μm or less. Structural defects were observed, on the other hands, when the overlap width exceeded about 180 μm up to 200 μm or more.

The preferable overlap width 18 is therefore about 180 μm or less as shown by the experimental results above.

Insulation resistance (IR) was measured with respect to the laminated ceramic capacitors in respective samples in the table after completing the laminated ceramic capacitors by forming auxiliary electrodes to the samples having overlap widths 18 of more than zero micrometer on the chips obtained after firing. The ratios of the samples having defective IR relative to the total sample number were determined, and the ratios of occurrence of samples with defective IR are also listed in TABLE 1.

Occurrence of defective IR and bending of the inner electrode 13 at its terminal edge are mutually related as shown in TABLE 1, suggesting that most of defective IR is caused by bending at the terminal edge of the inner electrode 13. The overlap width should more preferably in the range of about 20 to 140 μm considering defective IR due to bending.

The preferable range of the overlap width 18 as described above is influenced by various factors such as the viscosity of the ceramic paste 17 used, the content of solvents, the thickness of coating, and the angle 16 of the inclined face 15 at the periphery of the inner electrode 13. The allowable range of overlap also depends on the size and kind of the electronic components of laminated ceramics to be used. Accordingly, the preferable range of the overlap width 18 as described above is only an example, and the range may be wider or, on the contrary, be narrower in some cases.

As suggested in the foregoing discussions on the overlap width 18, the behavior of the ceramic paste 17 is influenced by the content of solvents therein. When the content of the solvent is about 40% by weight or more thereby to lower the viscosity of the ceramic paste 17, it was revealed that leveling of the ceramic paste 17 is more facilitated. For confirming the fact, the content of the solvent in the ceramic paste 17 was variously changed as shown in TABLE 2, and the paste was dried after a given time to measure the dimension 19 along the thickness of the ceramic paste 17 at the periphery of the inner electrode 13, and the film thickness 22 at the center of the ceramic paste 17. See FIG. 4B.

TABLE 2

| CONTENT OF SOLVENT (% BY WEIGHT) | DIMENSION 19 ALONG THE THICKNESS AT THE PERIPHERY (μm) | FILM THICKNESS 22 AT THE CENTER (μm) |
|---|---|---|
| 20 | 6 | 3 |
| 25 | 6 | 3 |
| 30 | 5 | 3 |
| 35 | 4 | 3 |
| 40 | 3 | 3 |
| 45 | 3 | 3 |
| 50 | 3 | 3 |
| 55 | 3 | 3 |
| 60 | 3 | 3 |
| 65 | 3 | 3 |
| 70 | 3 | 3 |
| 75 | 3 | 3 |
| 80 | 3 | 2.5 |
| 85 | 3 | 2.5 |

The data shown in TABLE 2 show the dimensions 19 along the thickness of the ceramic paste 17 at the periphery of the inner electrode 13, and the film thickness 22 at the center of the ceramic paste 17 after drying, respectively, when the ceramic paste 17 is applied so as to fill the step 14 while adjusting the step 14 of the inner electrode 13 to 3 μm and the inclination angle 16 of the inner electrode 13 to three degrees, wherein the distance 20 between two electrodes 13 is determined to be 500 μm and the ceramic paste 17 is applied with a width 21 of 600 μm.

TABLE 2 shows that the dimensions 19 along the thickness of the ceramic paste 17 at the periphery exceeds the dimension of the step 14 of the inner electrode 13, or the film thickness 22 at the center of the ceramic paste 17 after drying, respectively, of 3 μm, when the ceramic paste 17 contains less than about 40% by weight, or 35% by weight or less, of the solvent, showing that the paste has poor leveling property. When the solvent content is in the range of less than about 40% by weight, the dimension 19 along the thickness of the ceramic paste 17 at the periphery increases, showing that the leveling property is more deteriorated.

Figure 5:
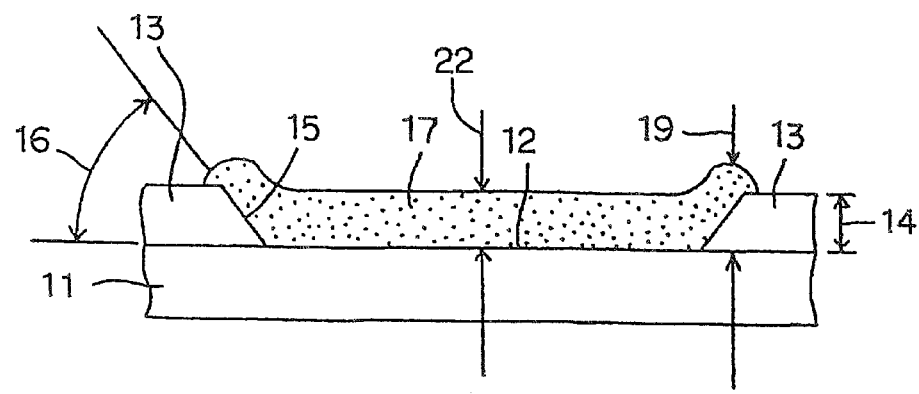
FIG. 5 is a cross section showing an inadequate state when the ceramic paste 17 contains a small amount of solvents.

FIG. 5 shows the situation of the applied ceramic paste 17 having a poor leveling property owing to a high viscosity of the ceramic paste 17 because it contains less than about 40% by weight of the solvent. Although the film thickness 22 at the center of the ceramic paste 17 is appropriate, the dimension 19 along the thickness of the ceramic paste 17 at the periphery is larger than the thickness at the center. The situation of the applied ceramic paste 17 shown in FIG. 5 is liable to appear when the overlap width 18 exceeds about 180 μm as described previously, or when the inclination angle 16 of the periphery of the inner electrode 13 exceeds three degrees as will be described hereinafter, when the ceramic paste 17 contains less than about 40% by weight of the solvent.

When the paste contains about 40% by weight to 85% by weight of the solvent, on the contrary, the dimension 19 along the thickness at the periphery of the ceramic paste 17 becomes approximately equal to the dimension of the step 14 of the inner electrode 13, showing a good leveling property. From the facts as described above, it is preferable that the ceramic paste 17 contains about 40% by weight to 85% by weight of the solvent.

The dimension 19 along the thickness is appropriate when the solvent content exceeds 75% by weight to as large a content as 80% by weight or 85% by weight as indicated in the column of "DIMENSION 19 ALONG THE THICKNESS AT THE PERIPHERY" in TABLE 2. However, it is not preferable that the content of the solvent is so high as shown in the column of "FILM THICKNESS 22 AT THE CENTER" in TABLE 2, because the ratio of contraction by drying of the ceramic paste 17 becomes high, thereby the film thickness 22 of the ceramic paste 17 at the center becomes smaller than the dimension of the step 14 of the inner electrode 13. It has been also experimentally confirmed that irregularity of the thickness by drying is liable to occur.

From the facts as described above, the upper limit of the solvent content in the paste is preferably about 75% by weight.

When the content of the solvent in the ceramic paste 17 is increased to about 40% by weight to 85% by weight and thereby the viscosity of the ceramic paste 17 is lowered, it is confirmed that the paste show a good leveling property even when the inclined face 15 is not formed at the periphery of the inner electrode 13 as described previously.

The inner electrode 13 is formed at the periphery so as to give an inclined face 15 with an acute angle against the principal face 12 of the ceramic green sheet 11. The angle 16 of the inclined face 15 against the principal face 12 is preferably selected to be within a range of 0.3 degree to 30 degrees as described previously.

Such angle 16 affect the projection length 23 of the inclined face 15 on the principal face 12 as shown by FIG. 4B. The projection length 23 becomes longer when the angle 16 is smaller, while the projection length 23 becomes shorter when the angle 16 is larger.

When the projection length 23 of the inclined face 15 is longer as described above, the region where the film thickness of the inner electrode 13 is thin is expanded to compromise continuity of metallic components contained in the inner electrode 13, possibly failing to exhibit the function of the inner electrode 13. Therefore, the lower limit of the angle 16 of the inclined face 15 is preferably selected to be about 0.3 degree from the view point as described above.

When the projection length 23 of the inclined face 15 is shortened, on the other hand, the allowable range for the printing position of the ceramic paste is narrowed. TABLE 3 shows the projection length 23 (in mm units) of the inclined face 15 when the angle 16 of the inclined face 15 and the film thickness 22 of the inner electrode 13 are variously changed.

TABLE 3

| | | FILM THICKNESS 22 ($\mu$m) | | | | |
|---|---|---|---|---|---|---|
| | | 1 | 3 | 5 | 10 | 20 |
| ANGLE 16 | 0.3 | 190 | 572 | 954 | 1910 | 3820 |
| (DEGREE) | 0.6 | 95 | 286 | 477 | 954 | 1910 |
| | 1 | 57 | 172 | 286 | 572 | 1150 |
| | 3 | 19 | 57 | 95 | 190 | 172 |
| | 10 | 6 | 17 | 28 | 56 | 113 |
| | 30 | 2 | 5 | 9 | 17 | 35 |

The positional accuracy of printing of the ceramic paste 17 is about 30 to 200 $\mu$m as described previously. Therefore, it is preferable that the projection length 23 of the inclined face 15 falls within this positional accuracy range. The numerical values surrounded by double lines in TABLE 3 falls within this positional accuracy range. As is evident from TABLE 3, the angles 16 of the inclined face 15, which enables the projection angle 23 of the inclined face 15 to fall within the range of 30 to 200 $\mu$m, can be selected from among the angles of 0.3, 0.6. 1, 3 and 10 degrees even when the film thickness 22 of the inner electrode 13 is adjusted to any thickness of 1, 3, 5, 10 and 20 $\mu$m. Therefore, the upper limit of the angles 16 of the inclined face 15 is selected to be about 30 degrees based on the results as described above.

By returning to the description of the method for manufacturing the laminated ceramic capacitor, the ceramic green sheets 11, in which the inner electrodes 13 are formed and the ceramic paste 17 is applied so as to substantially eliminate the steps 14, are laminated as shown by FIG. 4B to obtain a mother laminate.

Individual laminated ceramic capacitors can be obtained as unit capacitors in the lamination process of the ceramic green sheet 11. Then, a plurality of the ceramic green sheets 11 are laminated so that the terminal edge along the longitudinal direction where the inner electrode 13 reaches and the terminal edge along the longitudinal direction where the inner electrode 13 does not reach are alternately arranged along the direction of lamination.

After pressing the mother laminate, it is cut and isolated into individual laminates to serve as respective laminated capacitors that are fired thereafter. The desired laminated ceramic capacitor is completed by forming auxiliary electrodes at both ends of each laminate after firing.

Figure 6:
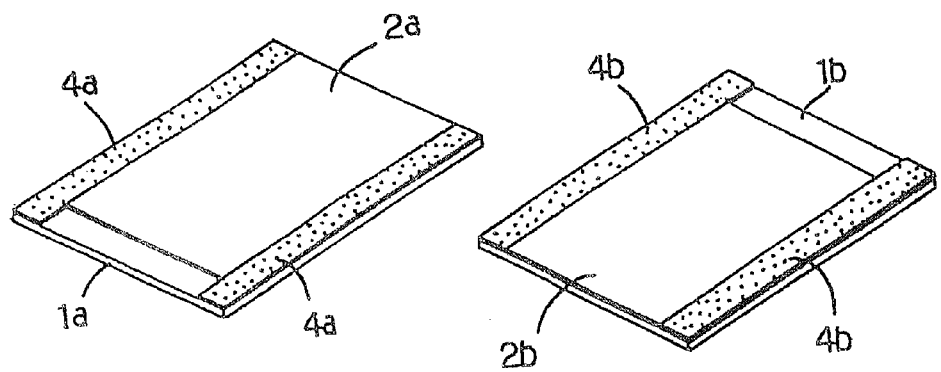
FIG. 6 corresponds to the processes (3A) and (3B) showing perspective views of the other embodiment of the present invention when the ceramic pastes 4a and 4b are applied.

The embodiment as shown in FIG. 6 may be employed with respect to the method for forming the laminated ceramic capacitor as described above. FIG. 6 corresponds to the processes (3A) and (3B) in FIG. 1. The same reference numerals are assigned to the elements in FIG. 6 as those for the corresponding elements shown in the processes (3A) and (3B) in FIG. 1, and any duplicating explanations are omitted.

This embodiment is characterized in that, when desired individual laminated ceramic capacitors are noticed as unit capacitors, the ceramic pastes 4a and 4b are applied in the processes for coating the ceramic pastes 4a and 4b merely in the regions sandwiched between the terminal edges along the transverse direction of each principal face of the green sheets 1a and 1b, and the inner electrodes 2a and 2b, respectively, as shown in FIG. 6.

In this embodiment, the ceramic pastes 4a and 4b are merely applied in the regions where the steps due to the thickness of each inner electrode 2a and 2b are particularly apt to be generated.

While the method for manufacturing the laminated ceramic capacitor was described according to the embodiments with reference to the drawings illustrative of the present invention, the present invention is not limited to the laminated ceramic capacitor. Instead, the present invention can be applied to the electronic components of laminated ceramics that function as resistors, inductors, varistors and filters.

The film of inner circuit elements comprises a conductive film such as an inner electrode in the foregoing embodiments. However, a variety of embodiments can be devised for the film of inner circuit elements since the present invention may be also applied for the electronic components of laminated ceramics having a variety of functions. For example, the film of inner circuit elements may be a circuit element film having relatively large electric resistance or other electric characteristics.

According to the present invention as hitherto described, the ceramic paste is applied so as to overlap the periphery of the film of inner circuit elements in order to substantially eliminate the steps due to the thickness of the film of inner circuit elements. Therefore, the ceramic paste can be easily applied on the film of inner circuit elements without generating any gaps even when the coating position has been a little shifted.

According to the first aspect of the present invention, the film of inner circuit elements is formed at the periphery so as to give an inclined face with acute angle against the principal face of the ceramic green sheet. Accordingly, the portion of the ceramic paste applied so as to overlap the periphery of the film of inner circuit elements promptly flows along the inclined face to smoothly level the ceramic paste.

In other words, the steps at the film of inner circuit elements serves for aligning the ceramic paste pattern. Consequently, the overlap portion can be prevented from having larger thickness than that of the other portions even when the ceramic paste is applied to overlap the periphery of inner circuit elements.

According to the second aspect of the present invention, the viscosity of the ceramic paste can be reduced by using a ceramic paste, which is applied on the principal face of the ceramic green sheet so as to eliminate the step due to the thickness of the film of inner circuit elements, containing about 40% by weight to 85% by weight of solvents. Consequently, the portions of the ceramic paste, applied so as to overlap the periphery of the film of inner circuit elements, can be smoothly leveled among the other portions, wherein the steps caused by the film of inner circuit elements serves for aligning the pattern of the ceramic paste. Consequently, the overlap portion can be prevented from being thicker than the other portions even when the ceramic paste is applied so as to overlap the periphery of the film of inner circuit elements.

Leveling of the ceramic paste can be more promptly and securely attained according to the third aspect of the present invention comprising both features of the first and second aspects.

According to the present invention, the ceramic green sheet can be made thin and multi-layered while preventing delamination and mechanical defects from generating, thereby allowing to obtain the electronic component of laminated ceramics having excellent performance.

The ceramic paste can be more securely leveled when the inclined face formed at the periphery of the film of inner circuit elements has an angle of about 0.3 degree to 30 degrees against the principal face of the ceramic green sheet.

Continuity of the film of inner circuit elements can be prevented from being compromised by adjusting the angle of the inclined face to about 0.3 degree or more because, when the angle is less than about 0.3 degree, the area covered with too thin film of inner circuit elements expands over the too long inclined face. The ceramic paste can be prevented from being applied to the undesirable area by adjusting the angle of the inclined face to about 30 degree or less because, when the angle is larger than about 30 degree, the allowable region of the printing position of the ceramic paste is narrowed since the length of the inclined face becomes too short.

The ceramic paste can be more securely leveled by adjusting the overlap width of the paste over the periphery of the film of inner circuit elements to about 180 $\mu$m or less in the present invention.

When the overlap width described above is selected to be within the range of about 20 to 140 $\mu$m, the electronic component of laminated ceramics scarcely has defective insulation resistance caused by bending at the terminal edge of the film of inner circuit elements.

Contraction of the film thickness of the ceramic paste at the center, or irregular film thickness caused by drying can be prevented in the present invention by setting the upper limit of the solvent content in the ceramic paste at about 75% by weight because, when the content is more than about 75%, contraction ratio by drying of the ceramic paste becomes too large.

What is claimed is:

1. A method for manufacturing an electronic component of laminated ceramics comprising the steps of:

providing a first ceramic green sheet;

providing a film of an inner circuit element on a part of a principal face of the first ceramic green sheet in a state of forming a step corresponding to the thickness of the film;

applying a ceramic paste on the principal face of the first ceramic green sheet so as to overlap the periphery of the film with an overlap width of about 180 $\mu$m or less so that the step due to the thickness of the film of inner circuit element is substantially eliminated; and laminating the first ceramic green sheet on which the ceramic paste has been applied to at least one second ceramic green sheet, wherein (ay the film is provided with an inclined face which forms an acute angle against the principal face of the first ceramic green sheet at the periphery of the film, or (b) the ceramic paste is applied so as to overlap only the periphery of the film or (c) the ceramic paste contains about 40% to 85% by weight of solvent or (d) a combination of at least two of (a) through (c).

2. A method for manufacturing an electronic component of laminated ceramics according to claim 1, wherein the film is provided with an inclined face which forms an acute angle against the principal face of the first ceramic green sheet at the periphery of the film.

3. A method for manufacturing an electronic component of laminated ceramics according to claim 2, wherein the ceramic paste contains about 40% to 85% by weight of a solvent.

4. A method for manufacturing an electronic component of laminated ceramics according to claim 3, wherein the film has a face inclined so as to have an angle of about 0.3 to 30 degrees against the principal face of the first ceramic green sheet, the ceramic paste is applied so as to overlap the periphery of the film with an overlap width of about 180 $\mu$m or less, and the ceramic paste comprises about 40% to 75% by weight of a solvent.

5. A method for manufacturing an electronic component of laminated ceramics according to claim 4, wherein the ceramic paste is applied so as to overlap the periphery of the film with an overlap width of about 20 to 140 $\mu$m.

6. A method for manufacturing an electronic component of laminated ceramics according to claim 1, wherein the ceramic paste is applied so as to overlap only the periphery of the film.

7. A method for manufacturing an electronic component of laminated ceramics according to claim 6, wherein the ceramic paste comprises about 40% to 85% by weight of a solvent.

8. A method for manufacturing an electronic component of laminated ceramics according to claim 1, wherein the ceramic paste is applied so as to overlap the periphery of the film with an overlap width of about 20 to 140 $\mu$m.

9. A method for manufacturing an electronic component of laminated ceramics according to claim 1, wherein a ceramic paste comprises about 40% to 85% by weight of a solvent.

10. A method for manufacturing an electronic component of laminated ceramics according to claim 9, wherein the ceramic paste comprises about 40% to 75% by weight of a solvent.

11. A method for manufacturing an electronic component of laminated ceramics according to claim 1, wherein the ceramic green sheet has a rectangular principal face having four terminal edges, the film is provided so as to reach only one of the four terminal edges, and wherein a plurality of the first ceramic green sheets are laminated such that the terminal edge reached by the film and a terminal edge not reached by the film are alternately arranged along the direction of lamination.

12. A method for manufacturing an electronic component of laminated ceramics according to claim 1, wherein the ceramic paste is applied on the entire area on the principal face of a ceramic green sheet not having the film thereon.

13. A method for manufacturing an electronic component of laminated ceramics comprising the steps of:
providing a first ceramic green sheet;
providing a film of an inner circuit element on a part of a principal face of the first ceramic green sheet in a state of forming a step corresponding to the thickness of the film;
applying a ceramic paste on the principal face of the first ceramic green sheet so as to overlap the periphery of the film so that the step due to the thickness of the film of inner circuit element is substantially eliminated; and
laminating the first ceramic green sheet on which the ceramic paste has been applied to at least one second ceramic green sheet,
wherein the film has a face inclined so as to have an angle of about 0.3 to 30 degrees against the principal face of the first ceramic green sheet at the periphery of the film.

14. A method for manufacturing an electronic component of laminated ceramics according to claim 13, wherein the ceramic paste is applied so as to overlap the periphery of the film with an overlap width of about 180 $\mu$m or less.

15. A method for manufacturing an electronic component of laminated ceramics according to claim 14, wherein the ceramic paste is applied so as to overlap the periphery of the film with an overlap width of about 20 to 140 $\mu$m.

16. A method for manufacturing an electronic component of laminated ceramics according to claim 15, wherein the ceramic paste comprises about 40% to 75% by weight of a solvent.

17. A method for manufacturing an electronic component of laminated ceramics according to claim 16, wherein the ceramic paste is applied to the terminal edges transverse to the terminal edge reached by the film and not to the terminal edge opposite the terminal edge reached by the film.

* * * * *